(12) United States Patent
Brintzinger et al.

(10) Patent No.: US 6,252,292 B1
(45) Date of Patent: Jun. 26, 2001

(54) VERTICAL ELECTRICAL CAVITY-FUSE

(75) Inventors: Axel C. Brintzinger, Fishkill; Roy Iggulden, Newburgh; Stefan J. Weber, Fishkill, all of NY (US); Peter Weigand, Unterhaching (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/328,960

(22) Filed: Jun. 9, 1999

(51) Int. Cl.[7] .................................................. H01L 29/00
(52) U.S. Cl. ............................................ 257/529; 438/467
(58) Field of Search .................................. 257/529, 530; 438/467

(56) References Cited

U.S. PATENT DOCUMENTS

| | | | |
|---|---|---|---|
| 4,630,357 | * 12/1986 | Rogers et al. | 438/672 |
| 4,635,345 | 1/1987 | Hankins et al. . | |
| 4,670,970 | 6/1987 | Bajor . | |
| 5,068,706 | * 11/1991 | Sugita et al. | 257/665 |
| 5,376,820 | * 12/1994 | Crafts et al. | 257/529 |
| 5,410,163 | * 4/1995 | Murakami | 257/530 |
| 5,420,456 | 5/1995 | Galbi et al. . | |
| 5,436,496 | 7/1995 | Jerome et al. . | |
| 6,081,021 | * 2/2000 | Gambino et al. | 257/529 |

FOREIGN PATENT DOCUMENTS

| | | |
|---|---|---|
| 0258149 | 8/1987 | (EP) . |
| 0554195 A1 | 8/1993 | (EP) . |
| 403124047 | 5/1991 | (JP) . |
| 404051563 | 2/1992 | (JP) . |

* cited by examiner

*Primary Examiner*—Sara Crane
(74) *Attorney, Agent, or Firm*—Connolly Bove Lodge & Hutz; Steven Capella

(57) ABSTRACT

A vertically arranged fuse structure for a semiconductor device. A fuse stud is vertically arranged with respect to a major plane of the semiconductor device and adjacent and electrically connected to overlying electrically conducting material and underlying electrically conducting material. A fuse void is present in the vertically arranged fuse stud. In an unblown state, the fuse provides electrical connection between the overlying electrically conducting material and the underlying electrically conducting material. The electrical connection being breakable by passing electrical energy of a predetermined level through the fuse.

21 Claims, 1 Drawing Sheet

VERTICAL ELECTRICAL CAVITY-FUSE

FIELD OF THE INVENTION

The invention relates to fuses for semiconductor devices.

BACKGROUND OF THE INVENTION

Fuses are included in semiconductor devices as in many electrical devices to help protect the devices from excessive levels of electrical current and thereby prevent damage to the devices. For example, metal fuses may be included in integrated circuits to reroute circuit features during and after wafer manufacturing processes. Some fuses are laser blown. With a laser blown fuse, laser power and spot location must be carefully controlled to minimize damage to adjacent fuses and to the underlayer structures including the semiconductor substrate.

In modern microelectronics, often, a rather large number of fuses must be incorporated into a rather small space to protect an increasingly large number of densely packed devices. For example, as memory capacity increases memory devices having similar or reduced size, the number of fuses increases.

According to one example, in currently utilized DRAM device design, the fuses typically consume an area of about 3% to about 5% of the total chip area. As device sizes continue to shrink, future generations of memory chips may be negatively impacted by the amount of area necessary for fuse structures. According to estimations, some DRAM devices may require on the order of 30,000 to 160,000 fuses.

This problem may be compounded by an increase and a need for redundancy. Accordingly, ways are being sought out to increase fuse density. One way of accomplishing an increase in fuse density is by reducing fuse pitch.

Another problem associated with fuse design is the need for providing a cavity adjacent to the fuses to provide a free volume for material displacement during fuse blowing. The free volume may also serve to limit interlevel dielectric crack propagation damage to adjacent structures.

As fuse density increases, the risk of damage to adjacent fuses may also increase.

SUMMARY OF THE INVENTION

To provide a solution to the above and other problems, among other things, the present invention provides a fuse structure and a process for forming the fuse structure that greatly reduces the area consumed by the fuse.

In accordance with these and other objects and advantages, aspects of the present invention provide a vertically arranged fuse structure for a semiconductor chip. The fuse structure includes a fuse stud vertically arranged with respect to a major plane of the semiconductor chip. The fuse stud is arranged adjacent and electrically connected to overlying electrically conducting material and underlying electrically conducting material. A fuse void is arranged in the vertically arranged fuse stud. In an unblown state, the fuse provides electrical connection between the overlying electrically conducting material and the underlying electrically conducting material. The electrical connection provided by the fuse is breakable by passing electrical energy of a predetermined level through the fuse.

Other aspects of the present invention provide a method forming a fuse structure on a semiconductor substrate. The method includes depositing a first layer of dielectric material. The first layer of dielectric material is etched down to underlying electrically conducting material to form a fuse stud cavity vertically oriented with respect to the major plane of the semiconductor substrate. An electrically conducting material is deposited in the fuse stud cavity to form a fuse stud, wherein a void is formed in the electrically conducting material as it is deposited.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

BRIEF DESCRIPTION OF THE DRAWINGS

The above-mentioned objects and advantages of the present invention will be more clearly understood when considered in conjunction with the accompanying drawings, in which.

DETAILED DESCRIPTION OF THE INVENTION

As described above, fuses occupy a large amount of space in a semiconductor device design. Typically, fuses are horizontally oriented. An example of a horizontally oriented fuse has a length of about 4 $\mu$m, a width of about 0.5 $\mu$m, and a thickness of about 0.5 $\mu$m.

By providing a vertically oriented fuse structure, the invention permits fuses to take up a much smaller area of real estate within a semiconductor device structure, such as a semiconductor chip, as compared to non-vertically oriented fuses. By providing a fuse structure that requires much less real estate the present invention permits a greatly increased number of fuses to be included in a semiconductor device structure. Additionally, by requiring less real estate, the present invention may permit more of other types of devices to be included in a semiconductor device structure. By vertically oriented, the present invention includes fuse structures that lie perpendicular to the major plane of a semiconductor device, or within about five degrees of perpendicular.

A vertically arranged fuse structure according to the present invention typically includes a vertically arranged fuse stud. The fuse stud is vertically arranged with respect to a major plane of the semiconductor device so as to be perpendicular to the major plane of the semiconductor device as described above. The fuse stud contacts directly or indirectly overlying electrically conducting material and underlying electrically conducting material. In an unblown state, the fuse structure provides electrical connection between overlying electrically connecting material and electrically connecting material. When electrical energy of a predetermined level passes through the fuse, the electrical connection may be broken.

A fuse structure according to the present invention may include a fuse void in the fuse stud. The void is a portion of the fuse stud devoid of stud material. In some instances, the void may not be entirely devoid of material and may contain some gaseous or vapor material(s), not necessarily the stud material.

Figure 4:
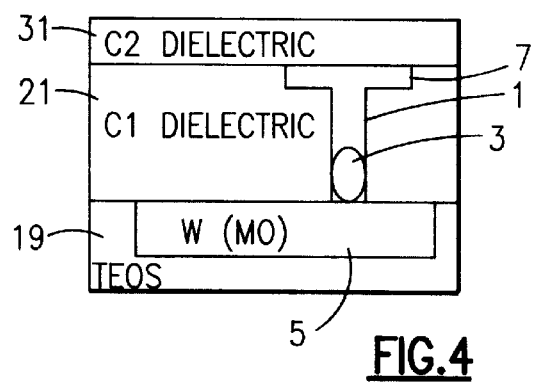
Figure 5:
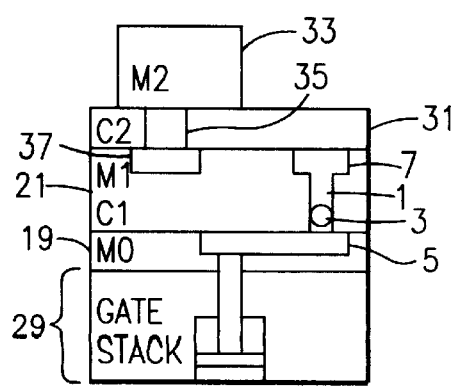
FIG. 5 represents a cross-sectional view of an embodiment of a semiconductor device including a fuse structure according to the present invention.

FIGS. 4 and 5 illustrate cross-sectional views of embodiments of a fuse structure according to the present invention and portions of associated semiconductor devices. As illustrated in FIG. 4, the present invention includes a fuse stud 1. The fuse stud 1 may extend between underlying electrically conducting material 5 and overlying electrically conducting material (not shown in FIG. 4). A fuse void 3 is present in each of the embodiments of the fuse stud 1 represented in FIGS. 4 and 5.

FIG. 5 also illustrates a gate stack structure 29 underlying region 15 and electrically connected to electrically conducting material 5. FIG. 5 also illustrates a second metal level 33 overlying and dielectric region 31 and electrically connected through connection structure 35 to a first metal level 37.

The embodiment of the fuse stud illustrated in FIG. 4 includes a fuse stud cap 7. The fuse stud cap represents an area having a greater cross-sectional dimension and the body of the fuse stud 1. It is the fuse stud cap that may contact overlying electrically conducting material.

The fuse stud 1, as well as the fuse stud cap, if included, may be made of any electrically conducting material. For example, the fuse stud may be made of aluminum. Other materials that may be utilized to form the fuse stud include copper, tungsten, aluminum alloys, other transition metals, transition metal alloys, and/or transition metal nitrides.

Typically, the fuse stud 1 has a circular cross-sectional shape. However, the fuse stud may have any cross-sectional shape.

The fuse stud may have a length of about 0.2 $\mu$m to about 0.7 $\mu$m. The cross-sectional area of the fuse stud about 0.1 $\mu$m to about 0.5 $\mu$m. Furthermore, the fuse stud 1 may have a maximum cross-sectional dimension of about 0.2 $\mu m^2$ to about 0.5 $\mu m^2$.

Typically, the fuse stud has a maximum cross-sectional dimension of less than about 0.2 microns. More typically, the fuse stud has a maximum cross-sectional dimension of less than about 0.175 microns. What the maximum cross sectional dimension represents may depend upon the cross-sectional shape of the fuse stud. For example, if the fuse stud has a circular cross-sectional shape then the maximum cross-sectional dimension will be the diameter of the circle.

The fuse stud cap 7 may be any shape. Along these lines, the fuse stud cap may have a width of from about 0.2 $\mu$m to about 2.0 $\mu$m and a length of from about 0.2 $\mu$m to about 10 $\mu$m and a thickness of from about 0.1 $\mu$m to about 1 $\mu$m. If it is the fuse stud cap that contacts overlying electrically conducting material, then the fuse stud cap may extend in the semiconductor device structure away from the fuse stud a distance required to contact the overlying electrically conducting material. Typically, the fuse stud cap is formed of the same material as the fuse stud.

The length and cross-sectional area/dimensions of the fuse stud may vary, depending upon the fuse operational characteristics. Among these operational characteristics are liner material, liner thickness, liner resistance, and/or etch profile.

As stated above, the fuse stud according to the present invention typically includes a fuse void 3. The fuse void may be arranged anywhere in the fuse stud. However, typically, the fuse void is arranged in a lower half of the fuse stud.

The location of the fuse stud void may at least in part be controlled by the process utilized to fill the fuse stud with electrically conducting material. Along these lines, the location and size of the fuse stud void may depend at least in part upon the aspect ratio of the fuse stud. The location and size of the void may also depend upon the liner material, liner thickness, liner resistance, and/or etch profile. For example, use of a less conformal liner of varying thickness may result in variation in the void location.

One function of the fuse void may be to facilitate the of the fuse and to facilitate separation of the fuse during blowing. It is thought that the fuse void plays a role in the fuse blowing as follows. The fuse stud reduces the cross-sectional area of the fuse stud that actually includes the electrically conducting material of the fuse stud. As a result, in the area of the fuse stud void, the fuse stud has reduced cross-sectional area. The reduced cross-sectional area may result in a large amount of current crowing. During fuse blowing, the current crowing will increase the temperature of the stud material surrounding the void, in other words, the remaining thinner portion of the fuse stud surrounding the fuse stud void. The increase in temperature will increase the resistance of the fuse stud in this area.

As a result of the increase in temperature, the fuse stud will begin to melt or disintegrate in the region of the void. The fuse stud facilitates the separation of the fuse and, hence, the blowing of the fuse by providing room for the melting process to proceed. As melting and disintegration of the fuse stud continues, it will lead to a larger separation of the fuse compared to conventional electrical fuses that do not include a fuse void or other cavity. As a result, a fuse structure according to the invention has a higher reliability as compared to such conventional electrical fuses lacking a cavity.

Typically, a fuse stud void according to the present invention has a length from about 0.1 $\mu$m to about 0.5 $\mu$m, a width of about 0.1 $\mu$m to about 0.5 $\mu$m, and a depth of about 0.1 $\mu$m to about 0.5 $\mu$m. Alternatively expressed, a typical fuse void included on a fuse structure according to the present invention has a volume from about 0.001 $\mu m^3$ to about 0.125 $\mu m^3$.

Typically, the volume of the fuse void is sufficient to result in a desired amount of reduced thickness of the walls of the electrically conducting material of the fuse stud in the vicinity of the fuse void so as to result in a desired amount of current flow, current crowing, and/or temperature increase. The fuse void typically has a volume sufficient to cause the fuse to blow upon flow of a predetermined level of electrical current through the fuse stud such that the increased temperature and resistance and fuse disintegration and melting will occur with the flow of electrical energy at or about the predetermined level. Characteristics of the fuse and its blowing may depend upon the material of the fuse stud and its melting point.

Typically, the fuse void has a volume sufficient to permit melting and disintegration of the fuse stud upon flow of the predetermined level electrical energy through the fuse stud. The predetermined level of electrical energy being as described herein the amount of electrical energy sufficient to result in blowing of the fuse. One of ordinary skill in the art would be able to determine the predetermined level of electrical energy without undue experimentation.

The overlying and underlying electrically conducting materials that the fuse structures is interconnected with may be metal. The metal structures may represent the wiring structures of the semiconductor device that includes the fuse.

The present invention also includes semiconductor devices, such as semiconductor chips that include a fuse structure according to the present invention. For example, the fuse structure according to the present invention may be part of a DRAM structure.

The present invention also includes methods for forming the above-described fuse structure. According to one embodiment of a method according to the present invention, various stages of which are illustrated in FIGS. 1–4, a substrate upon which the fuse structure is to be created may be provided. The structure that the fuse is to be formed on may vary. The structure illustrated in FIGS. 1–5 that the fuse is to be constructed on is a common DRAM structure. Most of the DRAM structure is not illustrated in FIGS. 1–5. FIGS. 1–5 illustrate only a portion of the DRAM structure up to the first metal level tungsten deposition.

Figure 1:
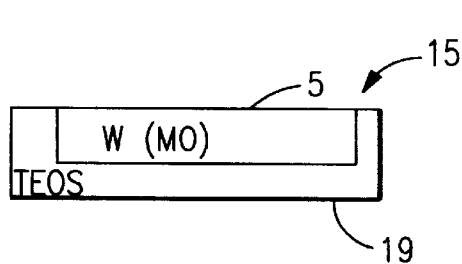
FIGS. 1–4 represent cross-sectional views of an embodiment of a fuse structure according to the present invention at various stages of an embodiment of a method according to the present invention for forming the fuse structure.
Figure 2:
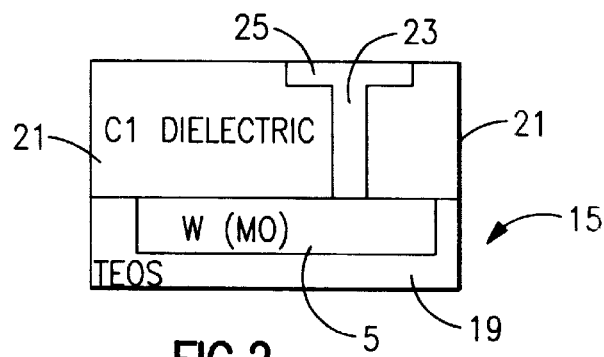

The structure 15 illustrated in FIG. 1 that the fuse structure is to be built upon includes electrically conducting region 5 that will form the underlying electrically conducting region to the fuse structure. In the structure illustrated in FIG. 1, the underlying electrically conducting material is tungsten. The electrically conducting region 5 in the embodiment shown in FIG. 1 is formed in a region of tetraethylorthosilicate (TEOS). FIG. 1 represents simply one example of a structure that a fuse structure according to the present invention may be formed upon. Any structure including any number of materials may be used to form a fuse structure on.

A first layer of a dielectric material 21 may be upon structure 15. Any dielectric material may be utilized. For example, a silicon oxide dielectric may be utilized. Examples of silicon oxide dielectrics include tetraethylorthosilicate (TEOS) derived or silane derived silicon oxides.

After depositing first dielectric layer 21, the dielectric may be etched down to the underlying electrically conducting material to form a fuse stud cavity 23 that will be filled with material to form the fuse stud. The fuse stud cavity 23 is vertically oriented with respect to the major plane of the semiconductor device including the fuse. Etching the fuse stud cavity 23 may also include etching region 25 for forming the fuse stud cap.

The fuse stud cavity and fuse stud cap cavity may have the same dimensions as described above for the fuse stud and fuse stud cap. According to one embodiment, at least the fuse stud cavity may have at least larger cross-sectional area that it is desired the fuse stud have. According to this embodiment, the fuse stud cavity may be lined with another material in addition to the fuse stud material, as described below in greater detail. forming the fuse stud cavity 23 and possibly fuse stud cap cavity 25, an electrically conducting material may be deposited in the fuse stud cavity 23 and possibly fuse stud cap cavity 25 to form the fuse stud. In depositing the fuse stud/fuse stud cap material, the etched dielectric may form a structure for depositing the electrically conducting material by a damascene process. Accordingly, the electrically conducting material filling of fuse stud void may be deposited by a damascene process.

The electrically conducting material 27 may be deposited by a variety of processes. According to one example, chemical vapor deposition and/or physical vapor deposition are utilized to deposit the electrically conducting material.

Figure 3:
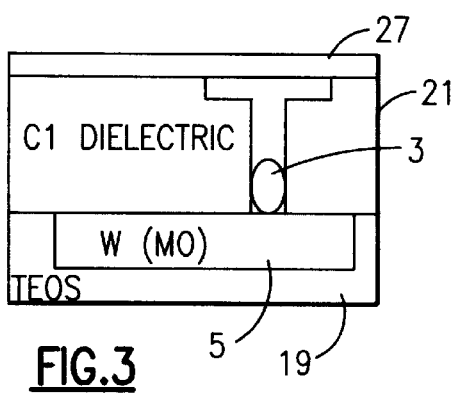

If the fuse structure includes the fuse stud cap, the fuse stud and fuse stud cap may be formed by a dual damascene deposition process. FIG. 3 illustrates an embodiment of a fuse structure after a dual damascene process for depositing the electrically conducting material. As can be seen in FIG. 3, a void 3 may be formed in the deposited electrically conducting material 27.

After depositing the electrically conducting material 27, electrically conducting material overlying the dielectric layer 21 as well as the fuse structure may be removed. According to one example, the electrically conducting material is removed by chemical mechanical polishing (CMP). After removal of the overlying portions of electrically conducting material 27, fuse stud cap 7 and fuse stud 1 remain.

After removing the electrically conducting material, a second layer of a dielectric material 31 may then be deposited over the entire structure. FIG. 4 illustrates the resulting structure.

Forming the fuse structure according to the present invention so as to result in the formation of the fuse void may be carried out by at least two processes. According to one process, the diameter of the fuse stud void 23 may be formed such that it is below a certain dimension. At this dimension, voids typically form when the fuse stud cavity is filled with electrically conducting material.

Along these lines, fuse voids were determined to be formed at dimensions below about 0.2 microns. More typically, a fuse stud cavity having a diameter of less than about 0.175 microns almost always resulted in the formation of a fuse void when the fuse stud cavity was filled with electrically conducting material. Further, by reducing the diameter of the fuse stud cavity below a certain level, the present invention realizes the filling of the fuse stud cavity and also the creation of at least one void in the electrically conducting material filling the fuse stud cavities.

Alternatively, the fuse stud cavities may be formed with larger dimensions. As referred to above, a liner may be selectively deposited in the cavities to result in the desired minimum dimension to result in the formation of the void in the electrically conducting material filling the cavity. The liner deposited on selected ones of the void typically includes an electrically conducting material. One example of such a material is titanium nitride.

Cavities in which the liner is not deposited would not have the desired sub minimum dimension. Therefore, these cavities will fill with electrically conducting material without formation of the void. These filled cavities may be utilized for other purposes.

Examples of voids formed in cavities are nucleation type voids and thermal budget-type voids. Nucleation-type voids typically form in the top to middle portion of filled vias. Thermal budget-type voids typically form in the bottom of vias. Thermal budget voids refers to voids formed as a result of a thermal budget experienced by a substrate.

It is to be understood that the invention is capable of use in various other combinations, modifications, and environments and is capable of changes or modifications within the scope of the inventive concept as expressed herein, commensurate with the above teachings, and/or the skill or knowledge of the relevant art.

We claim:

1. A vertically arranged fuse structure for a semiconductor device, the fuse structure comprising:
   a fuse stud of electrically conducting material vertically arranged with respect to a major plane of the semiconductor device arranged adjacent and electrically connected to overlying electrically conducting material and underlying electrically conducting material; and
   a fuse void in the vertically arranged fuse stud;

wherein in an unblown state, the fuse provides electrical connection between the overlying electrically conducting material and the underlying electrically conducting material, the electrical connection being breakable by passing electrical energy of a predetermined level through the fuse.

2. The fuse structure according to claim 1, further comprising:

a fuse stud cap arranged over and electrically connected to the fuse stud, the fuse stud cap being wider than the fuse stud and being electrically connected to the overlying electrically conducting material.

3. The fuse structure according to claim 1, wherein the fuse void is arranged in a lower half of the fuse stud.

4. The fuse structure according to claim 1, wherein the fuse stud is aluminum.

5. The fuse structure according to claim 1, wherein the fuse stud has a maximum cross-sectional dimension of less than 0.2 $\mu$m.

6. The fuse structure according to claim 1, wherein the fuse stud has a maximum cross-sectional dimension of less than 0.175 $\mu$m.

7. The fuse structure according to claim 1, wherein the fuse void has a volume sufficient to cause the fuse to blow upon flow of the predetermined level of electrical energy through the fuse stud.

8. The fuse structure according to claim 1, wherein the fuse void has a volume sufficient to cause current crowing in the fuse stud upon flow of the predetermined level o f electrical energy through the fuse stud.

9. The fuse structure according to claim 1, wherein the fuse void has a volume sufficient to result in melting and disintegration of the fuse stud in the vicinity of the fuse void upon flow of the predetermined level of electrical energy through the fuse stud.

10. The fuse structure according to claim 9, wherein the fuse void has a volume sufficient to receive melted fuse stud.

11. The fuse structure according to claim 1, wherein the fuse blows in the vicinity of the underlying electrically conducting material.

12. The fuse structure according to claim 1, wherein the overlying electrically conducting material and underlying electrically conducting material are metal.

13. A method of forming a fuse structure on a semiconductor substrate, the method comprising the steps of:

depositing a first layer of dielectric material;

etching the first layer of dielectric material down to underlying electrically conducting material to form a fuse stud cavity vertically oriented with respect to a major plane of the semiconductor substrate; and depositing an electrically conducting material in the fuse stud cavity to form a fuse stud, wherein a void is formed in the electrically conducting material as it is deposited.

14. The method according to claim 13, wherein the electrically conducting material is deposited by a damascene process.

15. The method according to claim 14, further comprising the step of:

removing portions of the deposited electrically conducting material by chemical-mechanical polishing.

16. The method according to claim 13, further comprising the step of:

etching a fuse stud cap cavity in the first layer of dielectric material at the top of the fuse stud cavity, wherein the electrically conducting material is deposited in the fuse stud cavity and fuse stud cap cavity by a dual damascene process.

17. The method according to claim 16, further comprising the step of:

removing portions of the deposited electrically conducting material by chemical-mechanical polishing.

18. The method according to claim 13, wherein the electrically conducting material is aluminum.

19. The method according to claim 13, wherein the electrically conducting material is deposited by chemical vapor deposition and physical vapor deposition.

20. The method according to claim 13, wherein the electrically conducting material includes a TiN liner deposited first in the fuse stud cavity and aluminum deposited second in the fuse stud cavity on the TiN liner.

21. The method according to claim 13, wherein the fuse void is formed in a lower half of the fuse stud.

* * * * *

UNITED STATES PATENT AND TRADEMARK OFFICE
CERTIFICATE OF CORRECTION

PATENT NO.    : 6,252,292 B1
DATED         : June 26, 2001
INVENTOR(S)   : Axel C. Brintzinger et al.

Page 1 of 1

It is certified that error appears in the above-identified patent and that said Letters Patent is hereby corrected as shown below:

Column 2,
Line 41, insert -- present -- after "the".

Column 4,
Line 10, after "the" insert -- blowing --.

Column 5,
Line 51, insert -- After -- before "forming".

Signed and Sealed this

First Day of January, 2002

Attest:

Attesting Officer

JAMES E. ROGAN
Director of the United States Patent and Trademark Office

UNITED STATES PATENT AND TRADEMARK OFFICE
CERTIFICATE OF CORRECTION

PATENT NO.    : 6,252,292 B1
DATED         : June 26, 2002
INVENTOR(S)   : Axel C. Brintzinger et al.

It is certified that error appears in the above-identified patent and that said Letters Patent is hereby corrected as shown below:

<u>Title page,</u>
Item [73], Assignee, should read:
-- International Business Machines Corporation, Armonk, NY (US) and Infineon Technologies North America Corp., San Jose, CA (US) --.

Signed and Sealed this

Eighteenth Day of January, 2005

JON W. DUDAS
*Director of the United States Patent and Trademark Office*